(12) United States Patent
Liao et al.

(10) Patent No.: US 11,342,494 B2
(45) Date of Patent: May 24, 2022

(54) PIEZOELECTRIC ACTUATOR AND PIEZOELECTRIC ACTUATING PLATE THEREOF

(71) Applicant: Microjet Technology Co., Ltd., Hsinchu (TW)

(72) Inventors: Hung-Hsin Liao, Hsinchu (TW); Shih-Chang Chen, Hsinchu (TW); Jia-Yu Liao, Hsinchu (TW); Yung-Lung Han, Hsinchu (TW); Wei-Ming Lee, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 1052 days.

(21) Appl. No.: 15/973,976

(22) Filed: May 8, 2018

(65) Prior Publication Data

US 2018/0331276 A1    Nov. 15, 2018

(30) Foreign Application Priority Data

May 12, 2017   (TW) .................................. 106115872

(51) Int. Cl.
*H01L 41/09* (2006.01)
*F15B 5/00* (2006.01)
(Continued)

(52) U.S. Cl.
CPC ............ *H01L 41/098* (2013.01); *F15B 5/006* (2013.01); *H01L 41/053* (2013.01);
(Continued)

(58) Field of Classification Search
CPC .......................... H01L 41/098; H01L 41/053
See application file for complete search history.

(56) References Cited

U.S. PATENT DOCUMENTS

| 2014/0377099 | A1* | 12/2014 | Hsueh | ...................... F04B 49/22 |
| | | | | 417/413.2 |
| 2016/0076530 | A1* | 3/2016 | Chen | ...................... F04B 45/047 |
| | | | | 417/413.2 |

(Continued)

FOREIGN PATENT DOCUMENTS

| JP | 10-164868 A | 6/1998 |
| JP | 2013-57247 A | 3/2013 |

(Continued)

*Primary Examiner* — Bryan P Gordon
(74) *Attorney, Agent, or Firm* — Birch, Stewart, Kolasch & Birch, LLP

(57) ABSTRACT

A piezoelectric actuator for a miniature fluid transportation device is provided and includes a piezoelectric actuating plate and a piezoelectric element. The piezoelectric actuating plate includes a suspension plate, an outer frame, and brackets. The suspension plate has a first thickness. The outer frame is arranged around the suspension plate and has a third thickness. Each of the brackets is connected between the suspension plate and the outer frame and has a fourth thickness. The third thickness is larger than the first thickness, and the first thickness is larger than the fourth thickness. The suspension plate, the outer frame and the brackets are constructed to form different stepped structures to minimize the thickness of the brackets, enhance the elasticity of the brackets. Thus, displacement of the suspension plate in the vertical direction is enhanced and the transportation efficiency of the miniature fluid transportation device is intensified.

18 Claims, 6 Drawing Sheets

(51) Int. Cl.
*H01L 41/053* (2006.01)
*H01L 41/313* (2013.01)
*H01L 41/332* (2013.01)

(52) U.S. Cl.
CPC ........ *H01L 41/0973* (2013.01); *H01L 41/313* (2013.01); *H01L 41/332* (2013.01)

(56) References Cited

U.S. PATENT DOCUMENTS

2017/0218938 A1* 8/2017 Chen .................. F16K 99/0048
2017/0218941 A1* 8/2017 Chen ....................... H01L 41/09
2017/0222121 A1* 8/2017 Chen ..................... F04B 43/046

FOREIGN PATENT DOCUMENTS

TW        M538545 U    3/2017
TW        M540932 U    5/2017

* cited by examiner

PIEZOELECTRIC ACTUATOR AND PIEZOELECTRIC ACTUATING PLATE THEREOF

FIELD OF THE INVENTION

The present invention relates to a piezoelectric actuator, and more particularly to a piezoelectric actuator applied to a miniature fluid transportation device and a piezoelectric actuating plate thereof.

BACKGROUND OF THE INVENTION

With the advancement of science and technology, fluid transportation devices used in many sectors such as pharmaceutical industries, computer techniques, printing industries or energy industries are developed toward elaboration and miniaturization. The fluid transportation devices are important components that are used in for example micro pumps, micro atomizers, printheads or industrial printers. Therefore, it is important to provide an improved structure of the fluid transportation device.

For example, in the pharmaceutical industries, pneumatic devices or pneumatic machines use motors or pressure valves to transfer gases. However, due to the volume limitations of the motors and the pressure valves, the pneumatic devices or the pneumatic machines are bulky in volume. In other words, the conventional pneumatic device fails to meet the miniaturization requirement, and is not suitable to be installed in or cooperated with portable equipment. Moreover, during operations of the motor or the pressure valve, annoying noise is readily generated. That is, the conventional pneumatic device is neither friendly nor comfortable to the user.

After the fluid transportation device is minimized, lighter and thinner for the above-mentioned fields, the fluid transmission performance of the miniature fluid transportation device is reduced with the volumetric reduction. Therefore, it is a need of providing a piezoelectric actuator to improve the performance of a miniature fluid transportation device and achieve a small-sized, miniaturized, and silent miniature fluid transportation device in order to eliminate the above drawbacks.

SUMMARY OF THE INVENTION

An object of the present invention provides a piezoelectric actuator applied to a miniature fluid transportation device. The piezoelectric actuator includes a suspension plate, an outer frame and brackets, which are formed by etching to construct different stepped structures in which the thickness of the brackets is minimized, so that the elasticity of the brackets and displacement of the suspension plate in the vertical direction are enhanced. As a result, the performance of the miniature fluid transportation device is intensified.

In accordance with an aspect of the present invention, there is provided a piezoelectric actuator for a miniature fluid transportation device. The piezoelectric actuator includes a piezoelectric actuating plate and a piezoelectric element. The piezoelectric actuating plate includes a suspension plate, an outer frame, at least one bracket and at least one recess. The suspension plate has a top surface and an opposing bottom surface. A bulge with a bulging surface is formed on the top surface of the suspension plate. A first thickness is defined between the top surface of the suspension plate and the bottom surface of the suspension plate, and a second thickness is defined between the bulging surface and the bottom surface of the suspension plate. The outer frame is arranged around the suspension plate and includes a top surface and an opposing bottom surface. A third thickness is defined between the top surface of the outer frame and the bottom surface of the outer frame. The at least one bracket is connected between the suspension plate and the outer frame, and includes a top surface and an opposing bottom surface. A fourth thickness is defined between the top surface of the at least one bracket and the bottom surface of the at least one bracket. The at least one recess is arranged nearby the at least one bracket and includes a recessed surface. The piezoelectric element is attached on the bottom surface of the suspension plate. The third thickness is larger than the first thickness, and the first thickness is larger than the fourth thickness.

In accordance with another aspect of the present invention, there is provided a piezoelectric actuating plate for a piezoelectric actuator of a miniature fluid transportation device. The piezoelectric actuating plate includes a suspension plate, an outer frame, at least one bracket and at least one recess. The suspension plate has a top surface and an opposing bottom surface. A bulge including a bulging surface is formed on the top surface of the suspension plate. A first thickness is defined between the top surface of the suspension plate and the bottom surface of the suspension plate, and a second thickness is defined between the bulging surface and the bottom surface of the suspension plate. The outer frame is arranged around the suspension plate and includes a top surface and an opposing bottom surface. A third thickness is defined between the top surface of the outer frame and the bottom surface of the outer frame. The at least one bracket is connected between the suspension plate and the outer frame, and includes a top surface and an opposing bottom surface. A fourth thickness is defined between the top surface of the at least one bracket and the bottom surface of the at least one bracket. The at least one recess is arranged nearby the at least one bracket and includes a recessed surface. The third thickness is larger than the first thickness, and the first thickness is larger than the fourth thickness.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
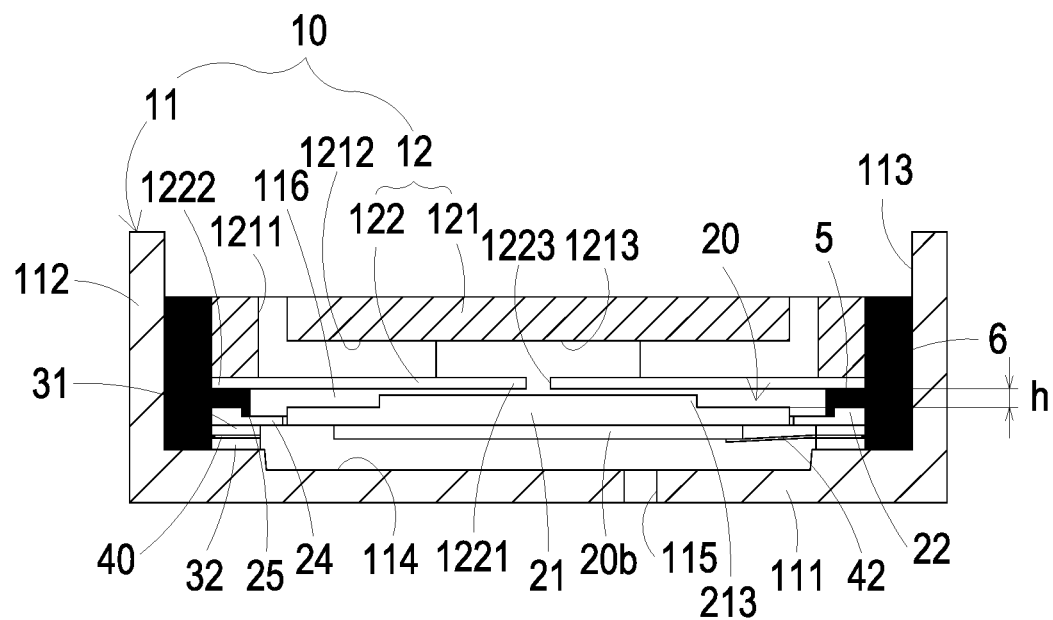
FIG. 1 is a schematic cross-sectional view illustrating a miniature fluid transportation device to which the piezoelectric actuator according to an embodiment of the present invention is applied.
Figure 2A:
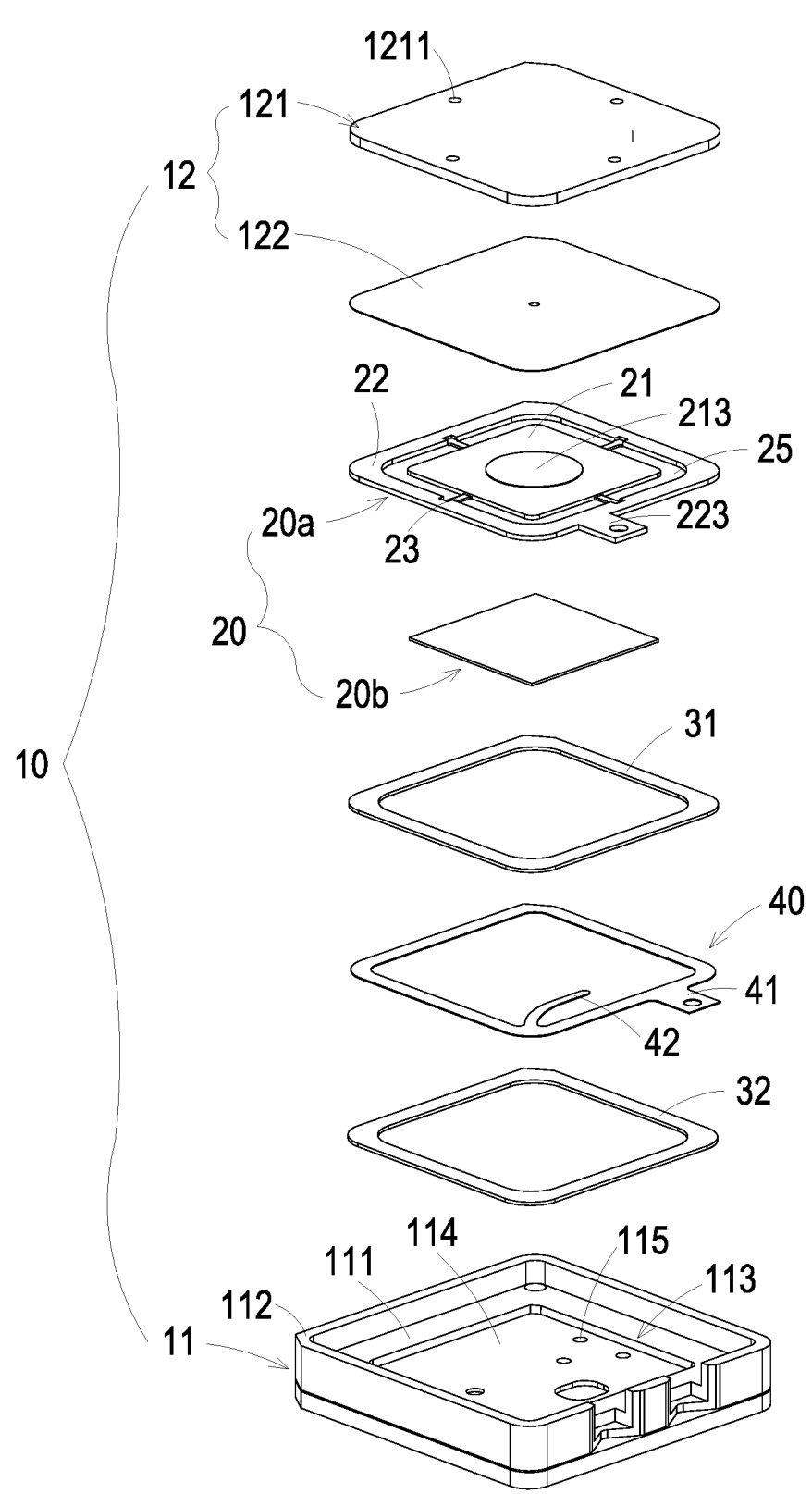
FIG. 2A is a schematic exploded view illustrating the miniature fluid transportation device of FIG. 1 and taken along a front side.
Figure 2B:
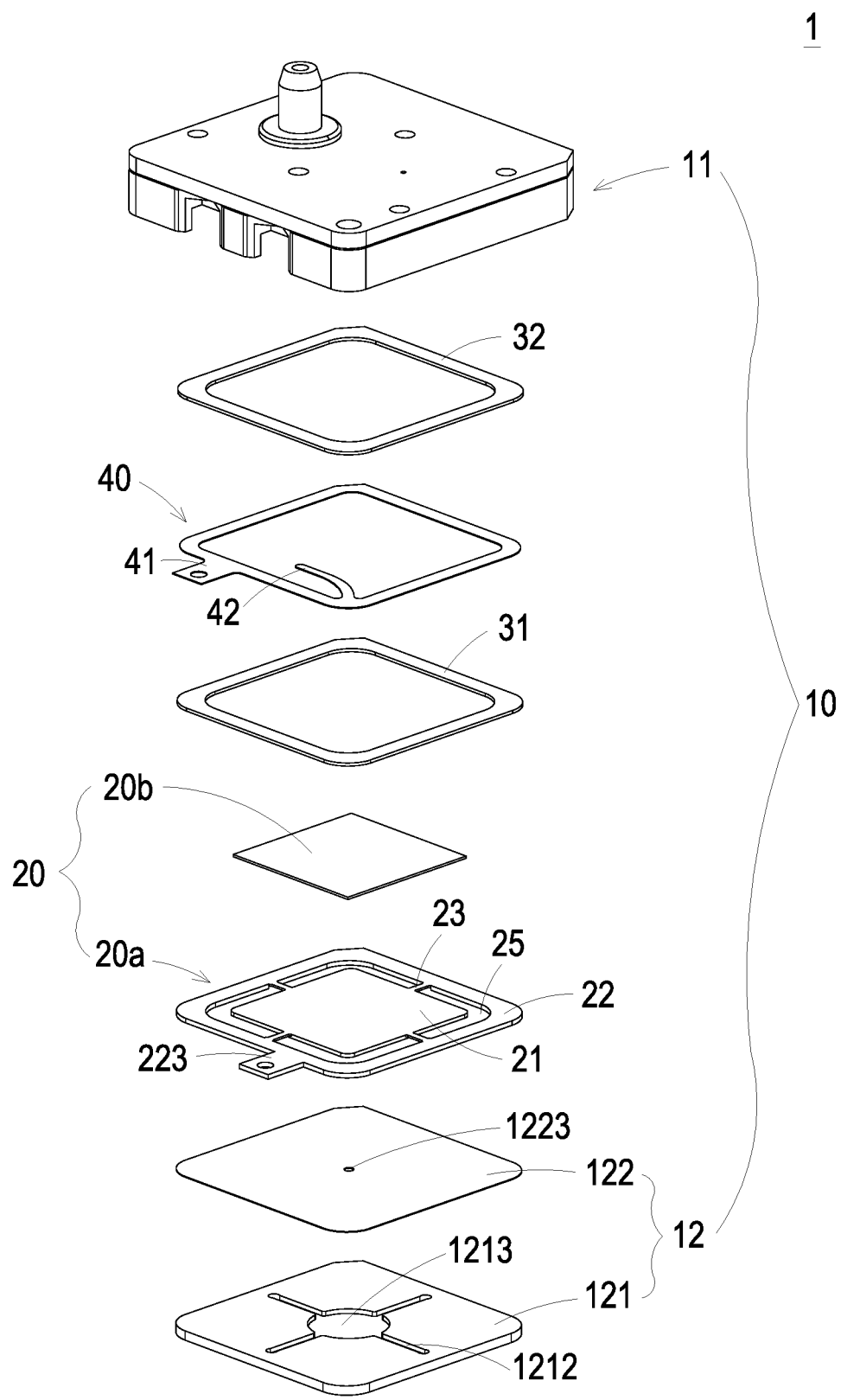
FIG. 2B is a schematic exploded view illustrating the miniature fluid transportation device of FIG. 1 and taken along a rear side.

Please refer to FIGS. 1, 2A and 2B. FIG. 1 is a schematic cross-sectional view illustrating a miniature fluid transportation device to which the piezoelectric actuator according to an embodiment of the present invention is applied. FIGS. 2A and 2B are schematic exploded views illustrating the miniature fluid transportation device of FIG. 1 and taken along front and rear sides respectively. The miniature fluid transportation device 1 includes a housing 10 and a piezoelectric actuator 20. The housing 10 includes a fluid outlet plate 11 and a base 12. The base 12 includes but not limited to a fluid inlet plate 121 and a resonance plate 122. The piezoelectric actuator 20 is spatially corresponding to the resonance plate 122. The fluid outlet plate 11, the piezoelectric actuator 20, the resonance plate 122 of the base 12 and the fluid inlet plate 121 of the base 12 are sequentially stacked on each other from bottom to top.

Please refer to FIG. 2A. In the embodiment, the fluid outlet plate 11 of the housing 10 includes a bottom plate 111 and a sidewall portion 112 protruding vertically from the edges of the bottom plate 111. An accommodation space 113 is defined by the bottom plate 111 and the sidewall portion 112 collaboratively, where the piezoelectric actuator 20 is disposed within. A temporary storage chamber 114 is concavely formed in an inner surface of the bottom plate 111. The bottom plate 111 includes at least one discharge opening 115 running therethrough and in communication with the temporary storage chamber 114. The fluid inlet plate 121 of the base 12 includes at least one inlet 1211. In the embodiment, the fluid inlet plate 121 has four inlets 1211, but not limited thereto. These inlets 1211 run through the top surface and bottom surface of the fluid inlet plate 121. In response to the action of the atmospheric pressure, the fluid is fed into the miniature fluid transportation device 1 through the inlets 1211. In addition, please refer to FIG. 2B. The fluid inlet plate 121 includes at least one convergence channel 1212 in communication with the at least one inlet 121 of the fluid inlet plate 121. There is a convergence chamber 1213 located at the intersection of the convergence channels 1212 and in communication therewith. After the fluid is introduced into the at least one convergence channel 1212 through the at least one inlet 1211, the fluid is guided to the convergence chamber 1213.

In the embodiment, the miniature fluid transportation device 1 further includes a first insulation plate 31, a second insulation plate 32 and a conducting plate 40. The first insulation plate 31, the conducting plate 40 and the second insulation plate 32 are stacked on each other sequentially, accommodated within the accommodation space 113 and located between the piezoelectric actuator 20 and the bottom plate 111 of the fluid outlet plate 11.

As shown in FIG. 1, in the embodiment, the fluid inlet plate 121 is integrally formed to have the at least one inlet 1211, the at least one convergence channel 1212 and the convergence chamber 1213. After the fluid inlet plate 121 and the resonance plate 122 are assembled, the convergence chamber 1213 can temporarily store the fluid. Hereinafter, the region of the resonance plate 122 corresponding to the convergence chamber 1213 is referred as a movable part 1221 of the resonance plate 122, whereas the region of the resonance plate 122 fixed on the base 12 is referred as a fixed part 1222. The resonance plate 122 has a central aperture 1223 corresponding to the convergence chamber 1213 of the fluid inlet plate 121 for communicating fluid. In this embodiment, the resonance plate 122 can be made of for example but not limited to a flexible material. In another embodiment, the resonance plate 122 can be made of for example but not limited to a copper material.

In some embodiments, the fluid inlet plate 121 can be made of but not limited to stainless steel. In some embodiments, the depth of the convergence chamber 1213 and the depth of the at least one convergence channel 1212 can be for example but not limited to equal.

Figure 3A:
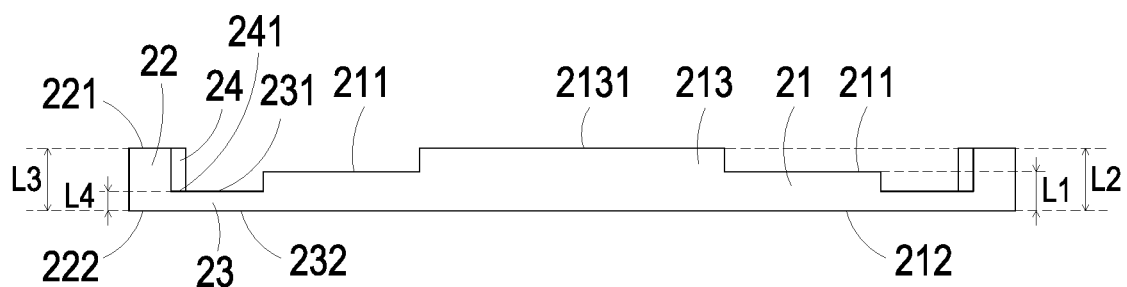
FIG. 3A is a schematic cross-sectional view illustrating a piezoelectric actuating plate according to a first embodiment of the present invention.
Figure 3B:
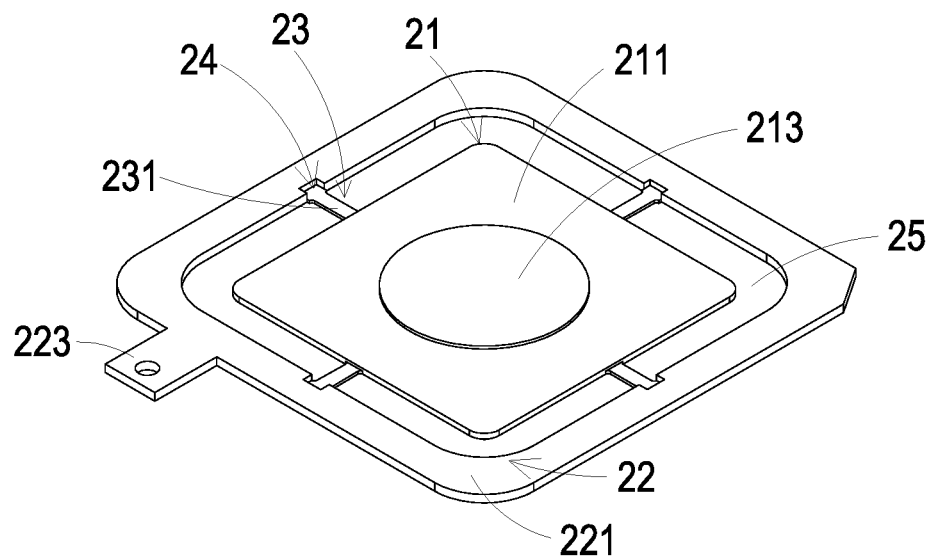
FIG. 3B is a schematic perspective view illustrating the piezoelectric actuating plate according to the first embodiment of the present invention.

Please refer to FIGS. 2A, 2B, 3A and 3B. FIG. 3A is a schematic cross-sectional view illustrating a piezoelectric actuating plate according to a first embodiment of the present invention. FIG. 3B is a schematic perspective view illustrating the piezoelectric actuating plate according to the first embodiment of the present invention. The above piezoelectric actuator 20 is aligned with the resonance plate 122, and further includes a piezoelectric actuating plate 20a and a piezoelectric element 20b. The piezoelectric actuating plate 20a includes a suspension plate 21, an outer frame 22 and at least one bracket 23. The suspension plate 21 includes a top surface 211 and an opposing bottom surface 212. A bulge 213 is formed on the top surface 211 of the suspension plate 21. Hereinafter, a first thickness L1 is defined between the top surface 211 of the suspension plate 21 and the bottom surface 212 of the suspension plate 21, and a second thickness L2 is defined between a bulging surface 2131 of the bulge 213 and the bottom surface 212 of the suspension plate 21. The piezoelectric element 20b can be for example but not limited to a piezoelectric ceramic plate. The piezoelectric element 20b is attached on the bottom surface 212 of the suspension plate 21. The outer frame 22 is arranged around the suspension plate 21 and includes a top surface 221 and an opposing bottom surface 222. A third thickness L3 is defined between the top surface 221 of the outer frame 22 and the bottom surface 222 of the outer frame 22. The at least one bracket 23 is connected between the suspension plate 21 and the outer frame 22, and includes a top surface 231 and an opposing bottom surface 232. A fourth thickness L4 is defined between the top surface 231 of the at least one bracket 23 and the bottom surface 232 of the at least one bracket 23. The third thickness L3 of the outer frame 22 is larger than the first thickness L1 of the suspension plate 21, and the first thickness L1 of the suspension plate 21 is larger than the fourth thickness L4 of the at least one bracket 23. Moreover, in an embodiment, the third thickness L3 of the outer frame 22 and the second thickness L2 between the bulging surface 2131 of the bulge 213 and the bottom surface 212 of the suspension plate 21 can be for example but not limited to equal.

Since aforesaid piezoelectric actuator 20 has minimized the fourth thickness L4 of the at least one bracket 23, the rigidity of the at least one bracket 23 is reduced and the elasticity of the at least one bracket 23 is enhanced. Thus, the displacement of the suspension plate 21 in the vertical motion is increased, so that the transferred volume of the fluid is increased and the performance of the miniature fluid transportation device 1 is intensified.

Please refer to FIGS. 3A and 3B. In the first embodiment of the present invention, the piezoelectric actuating plate 20a further includes at least one recess 24. The recess 24 is formed on the top surface 221 of the outer frame 22 and abutting the edge of the at least one bracket 23. The recess 24 has a recessed surface 241. In the embodiment, there are four brackets 23 and four corresponding recesses 24, but not limited thereto. In this embodiment, the bottom surface 212 of the suspension plate 21, the bottom surface 232 of the at least one bracket 23 and the bottom surface 222 of the outer frame 22 are coplanar. The bulging surface 1231 of the bulge 213 and the top surface 221 of the outer frame 22 are coplanar. The recessed surface 241 of the at least one recess 24 and the top surface 231 of the at least one bracket 23 are coplanar. In this embodiment, the bottom surface 212 of the suspension plate 21, the bottom surface 232 of the bracket 23 and the bottom surface 222 of the outer frame 22 are formed as a coplanar bottom surface, whereas the bulge 213, the suspension plate 21 and the bracket 23 are formed as a stepped structure since they have different heights of their top surfaces.

In the first embodiment, the piezoelectric actuating plate 20a has an integrated structure, wherein the top surface 211 of the suspension plate 21, the top surface 231 of the bracket 23 and the recessed surface 241 of the recess 24 are formed by etching the material at the same side so that a stepped structure with the coplanar bottom surface is formed.

Figure 4A:
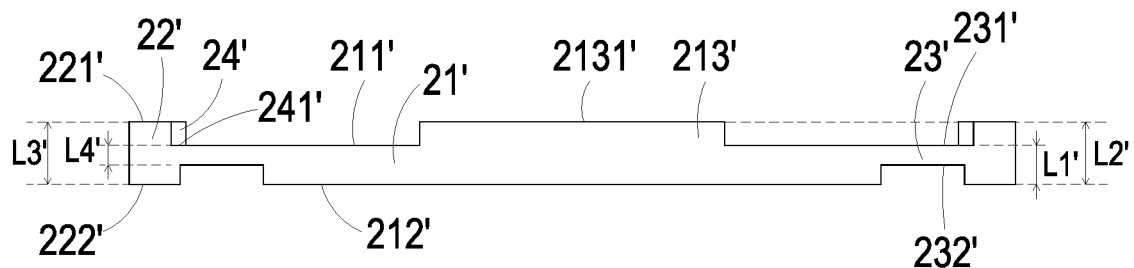
FIG. 4A is a schematic cross-sectional view illustrating a piezoelectric actuating plate according to a second embodiment of the present invention.
Figure 4B:
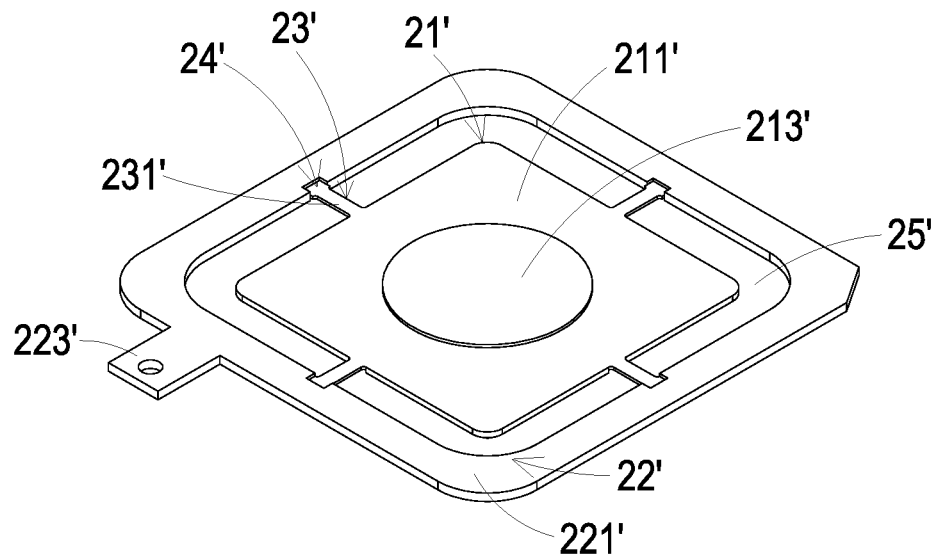
FIG. 4B is a schematic perspective view illustrating the piezoelectric actuating plate according to the second embodiment of the present invention.
Figure 4C:
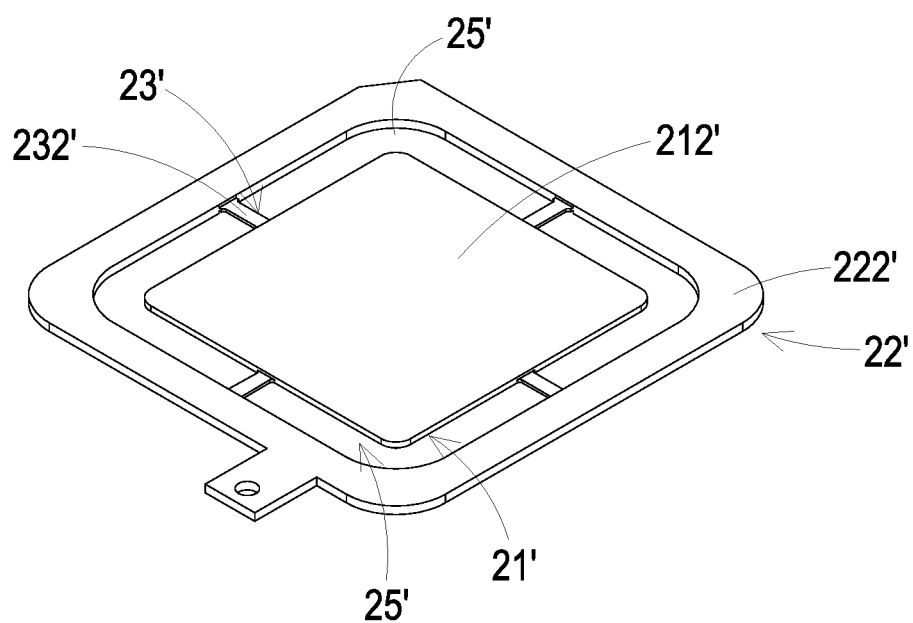
FIG. 4C is another schematic perspective view illustrating the piezoelectric actuating plate according to the second embodiment of the present invention.

Please refer to FIGS. 4A, 4B and 4C. FIG. 4A is a schematic cross-sectional view illustrating a piezoelectric actuating plate according to a second embodiment of the present invention. FIGS. 4B and 4C are schematic perspective views illustrating the piezoelectric actuating plate according to the second embodiment of the present invention. In the second embodiment, the piezoelectric actuating plate 20a' includes at least one recess 24' having a recessed surface 241'. The bottom surface 212' of the suspension plate 21' and the bottom surface 222' of the outer frame 22' are coplanar. The bulging surface 2131' of the bulge 213' and the top surface 221' of the outer frame 22' are coplanar. The top surface 211' of the suspension plate 21', the recessed surface 241' of the at least one recess 24' and the top surfaces 231' of the at least one bracket 23' are coplanar. Consequently, the top and bottom surfaces of the piezoelectric actuating plate 20a' are formed as a stepped-up and stepped-down structure with non-coplanar surfaces at two different sides.

In the second embodiment, the piezoelectric actuating plate 20a' has an integrated structure. The top surface 211' of the suspension plate 21', the top surface 231' of the bracket 23' and the recessed surface 241' of the recess 24' are formed by etching a first side of the material, whereas the bottom surface 232' of the bracket 23' is formed by etching an opposing second side of the material.

In the second embodiment, the third thickness L3' of the outer frame 22' is ranged from 295 μm to 305 μm. The first thickness L1' of the suspension plate 21' is ranged from 265 μm to 275 μm. The fourth thickness L4' of the bracket 23' is ranged from 250 μm to 260 μm. The second thickness L2' defined between the bulging surface 2131 of the bulge 213 and the bottom surface 212 of the suspension plate 21 is equal to the third thickness L3' of the outer frame 22', and ranged from 295 μm to 305 μm, but not limited thereto.

In order to produce the piezoelectric actuating plate 20a, 20a' of the present invention, different stepped structures are made by etching the material to form the suspension plate 21 and 21', the outer frame 22 and 22', and the bracket 23 and 23'. The design of such structure is pursuing enhancement of the elasticity of the bracket 23, 23' and the displacement of the suspension plate 21, 21' in vertical motion, so as to intensify the performance of the miniature fluid transportation device 1. The fourth thickness L4' describes the thickness of the bracket 23', while the displacement of the suspension plate 21' and the performance of the miniature fluid transportation device 1 are related to the fourth thickness L4' as listed in Table 1 below.

TABLE 1

| The fourth thickness L4' of the bracket | The displacement of the suspension plate | Maximum output pressure |
| --- | --- | --- |
| 265~275 μm | 6.5 μm | 259 mmHg |
| 250~260 μm | 10 μm | 451 mmHg |

The experiment result data of the above table indicates that while the fourth thickness L4' of the bracket 23' is decreased from 265~275 μm to 250~260 μm, the bracket 23' with certain rigidity for adequately connecting the suspension plate 21' and the outer frame 22' has its elasticity increased. In the meantime, while the suspension plate 21' is driven by the piezoelectric element 20b, the vibrating displacement of the suspension plate 21' in the vertical direction is increased from 6.5 μm to 10 μm. Consequently, the maximum output pressure of the miniature fluid transportation device 1 is increased from 259 mmHg to 451 mmHg. Therefore, optimizing the thickness of the bracket 23' in the present invention can effectively improve the efficiency of the miniature fluid transportation device 1, and has the advantages of high performance. More especially, the main focus of research and development of the miniature fluid transportation device 1 is on its transportation efficiency.

Please refer to FIG. 2A. The piezoelectric element 20b has a square shape. The length of a side of the piezoelectric element 20b is equal to or less than the length of a side of the suspension plate 21. The piezoelectric element 20b is attached on the suspension plate 21. In some embodiments, the suspension plate 21 is a flexible square plate. The outer frame 22 has its profile substantially matching the profile of the suspension plate 21 and is arranged around the suspension plate 21, while the outer frame 22 is a square hollow frame. Moreover, four brackets 23 are connected between the suspension plate 21 and the outer frame 22 for elastically supporting the suspension plate 21. Please refer to FIGS. 3A, 3B, 4A and 4B. The suspension plate 21, 21', the outer frame 22, 22' and the four brackets 23, 23' are integrally formed and made by etching a metal plate, for example but not limited to a stainless steel plate. That is, the piezoelectric actuator 20 of the miniature fluid transportation device 1 can be for example but not limited to a combination of the piezoelectric element 20b and the processed metal plate. The outer frame 22, 22' is arranged around the suspension plate 21, 21' and has a conducting pin 223, 223' protruded outwardly from the outer frame 22, 22' for an electrically external connection, but not limited thereto. Moreover, the four brackets 23, 23' are connected between the suspension plate 21, 21' and the outer frame 22, 22' for elastically supporting the suspension plate 21, 21'. In this embodiment, a first end of each bracket 23, 23' is connected to the corresponding lateral rim of the suspension plate 21, 21', and a second end of each bracket 23, 23' is connected to the corresponding inner rim of the outer frame 22, 22'. Moreover, at least one vacant space 25, 25' is formed between the brackets 23, 23' the suspension plate 21, 21' and the outer frame 22, 22' for allowing the fluid to go through. The types of the suspension plate 21, 21' and the outer frame 22, 22' and the type and the number of the brackets 23, 23' may be varied according to the practical requirements. Since the brackets 23, 23' are perpendicularly connected between the suspension plate 21, 21' and the outer frame 22, 22', the non-uniform deflection angle of the suspension plate 21, 21' during operation is decreased, which is beneficial to increase the amplitude of the suspension plate 21, 21' in the Z axis and the motion of the suspension plate 21, 21' in the vertical direction is enhanced. That is, the operation of the suspension plate 21, 21' becomes more stable and uniform. Under this circumstance, the stability and performance of the piezoelectric actuator 20 are enhanced. In this embodiment, the bugle 213, 213' on the suspension plate 21, 21' the suspension plate 21, 21' and the at least one bracket 23, 23' are configured to form a stepped structure, and the thicknesses thereof are decreased gradually.

In addition, the conducting plate 40 is clamped between the first insulation plate 31 and the second insulation plate 32 along the vertical direction. The first insulation plate 31 and the second insulation plate 32 are made of an insulating material, for example but not limited to a plastic material, for providing insulating efficacy. The conducting plate 40 is made of an electrically conductive material, for example but not limited to a metallic material, for providing electrically conducting efficacy. Moreover, the conducting plate 40 may have a conducting pin 41 and an electrode 42. The conducting pin 41 is used for an electrically external conduction and the electrode 42 is used for an electrical connection with the piezoelectric element 20b. Thus, an external power is electrically connected to the piezoelectric element 20b through the conducting pin 41, the conducting plate 40 and the electrode 42.

Please refer to FIGS. 1, 2A and 2B. For assembling the miniature fluid transportation device 1, the first insulation plate 31, the conducting plate 40, the second insulation plate 32, the piezoelectric actuator 20 and the base 12 are sequentially stacked on each other from bottom to top and joined by adhesive to be an assembly. Moreover, after the assembly is putted into the accommodation space 113 of the fluid outlet plate 11, an adhesive 6 is coated on the inner surfaces of the sidewall portion 112 of the fluid outlet plate 11 to fill the accommodation space 113 between the sidewall portion 112 and the assembly, thus sealing the laterals of the assembly to avoid fluid leakage and forming the compact-size, miniature fluid transportation device 1. When a voltage is applied to the piezoelectric element 20b, the piezoelectric element 20b is stretched or contracted. Consequently, the suspension plate 21 is subjected to the curvy vibration. While the suspension plate 21 is subjected to the curvy vibration, the movable part 1221 of the resonance plate 122 is also subjected to vibration, which makes the fluid fed into the at least one inlet 1211 of the base 12. After the fluid is fed into the at least one inlet 1211, the fluid is transferred to the convergence chamber 1213 through the at least one convergence channel 1212. Then, the fluid is transferred to the temporary storage chamber 114 through the central aperture 1223 of the resonance plate 122. Due to the vibration of the suspension plate 21 of the piezoelectric actuator 20 and the resonance effect of the resonance plate 122, the volume of the temporary storage chamber 114 is shrunken. Consequently, the fluid is outputted from the at least one discharge opening 115 of the fluid outlet plate 11. In such way, the fluid can be transferred through the miniature fluid transportation device 1.

Furthermore, as shown in FIG. 1, there is a gap h between the resonance plate 122 and the piezoelectric actuator 20, and a glue layer 5, for example but not limited to a conductive adhesive, is inserted into the gap h. Consequently, the depth of the gap h between the resonance plate 122 and the suspension plate 21 of the piezoelectric actuator 20 is maintained, which is capable of guiding the gas to flow more quickly. Moreover, due to the depth of the gap h, a compressible chamber 116 is defined between the resonance plate 122 and the piezoelectric actuator 20, which can make the fluid flowing from the central aperture 1223 of the resonance plate 122 flow more quickly between chambers. Moreover, due to the proper distance between the suspension plate 21 and the resonance plate 122, the contact interference is reduced and the generated noise is largely reduced.

Moreover, as mention above, a glue layer 5 is arranged between the outer frame 22 of the piezoelectric actuator 20 and the resonance plate 122. During the process of applying the glue layer 5, the glue layer 5 may flow over the top surface 221 of the outer frame 22 and flow toward the bracket 23 because of the capillary action of the outer frame 23. The overflowing glue of the glue layer 5 may flow over the outer frame 22 and stick on the bracket 23. For avoiding the problem, a recess 24 is formed on the top surface 221 of the outer fame 22. As so, the overflowing glue of the glue layer 5 can be received within the recess 24 to prevent the overflowing glue of the glue layer 5 to stick on the bracket 23.

In summary, the present invention provides a piezoelectric actuator applied to a miniature fluid transportation device. The piezoelectric actuator includes a suspension plate, an outer frame and brackets configured to form different stepped structures by etching. Since the thickness of the brackets is lesser than the suspension plate and the outer frame to be minimized, the elastically of the bracket and displacement of the suspension plate in the vertical direction are enhanced. As a result, the performance of the miniature fluid transportation device is intensified. The miniature fluid transportation device is minimized, lighter and thinner and the improved effects thereof are better, so as to achieve the purpose of intensifying the performance. Therefore, the piezoelectric actuator of the present invention is extremely valuable for industrial use and has been filed accordingly.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A piezoelectric actuator for a miniature fluid transportation device, comprising:
    a piezoelectric actuating plate comprising:
        a suspension plate having a top surface and an opposing bottom surface, wherein a bulge with a bulging surface is formed on the top surface of the suspension plate, wherein a first thickness is defined between the top surface of the suspension plate and the bottom surface of the suspension plate, and a second thickness is defined between the bulging surface and the bottom surface of the suspension plate;

an outer frame arranged around the suspension plate and comprising a top surface and an opposing bottom surface, wherein a third thickness is defined between the top surface of the outer frame and the bottom surface of the outer frame;

at least one bracket connected between the suspension plate and the outer frame, comprising a top surface and an opposing bottom surface, wherein a fourth thickness is defined between the top surface of the at least one bracket and the bottom surface of the at least one bracket; and at least one recess arranged nearby the at least one bracket and comprising a recessed surface; and a piezoelectric element attached on the bottom surface of the suspension plate;

wherein the third thickness is larger than the first thickness, and the first thickness is larger than the fourth thickness.

2. The piezoelectric actuator according to claim 1, wherein the third thickness is equal to the second thickness.

3. The piezoelectric actuator according to claim 1, wherein the bulging surface of the bulge and the top surface of the outer frame are coplanar, the recessed surface of the at least one recess and the top surface of the at least one bracket are coplanar, and the bottom surface of the suspension plate, the bottom surface of the at least one bracket and the bottom surface of the outer frame are coplanar.

4. The piezoelectric actuator according to claim 3, wherein the top surface of the suspension plate, the top surface of the at least one bracket and the recessed surface of the at least one recess are configured to form a stepped structure with a coplanar surface by etching.

5. The piezoelectric actuator according to claim 1, wherein the bulging surface of the bulge and the top surface of the outer frame are coplanar, the recessed surface of the at least one recess and the top surfaces of the at least one bracket and the suspension plate are coplanar, and the bottom surface of the suspension plate and the bottom surface of the outer frame are coplanar.

6. The piezoelectric actuator according to claim 5, wherein the top surface of the suspension plate, the top surface of the at least one bracket and the recessed surface of the at least one recess are formed by etching to be non-coplanar with each other and to form a stepped-up and stepped-down structure.

7. The piezoelectric actuator according to claim 1, wherein the third thickness is ranged from 295 μm to 305 μm.

8. The piezoelectric actuator according to claim 1, wherein the first thickness is ranged from 265 μm to 275 μm.

9. The piezoelectric actuator according to claim 1, wherein the fourth thickness is ranged from 250 μm to 260 μm.

10. A piezoelectric actuating plate for a piezoelectric actuator of a miniature fluid transportation device, the piezoelectric actuating plate comprising:

a suspension plate having a top surface and an opposing bottom surface, wherein a bulge with a bulging surface is formed on the top surface of the suspension plate, wherein a first thickness is defined between the top surface of the suspension plate and the bottom surface of the suspension plate, and a second thickness is defined between the bulging surface and the bottom surface of the suspension plate;

an outer frame arranged around the suspension plate and comprising a top surface and an opposing bottom surface, wherein a third thickness is defined between the top surface of the outer frame and the bottom surface of the outer frame;

at least one bracket connected between the suspension plate and the outer frame, comprising a top surface and an opposing bottom surface, wherein a fourth thickness is defined between the top surface of the bracket and the bottom surface of the bracket; and at least one recess arranged nearby the at least one bracket and comprising a recessed surface;

wherein the third thickness is larger than the first thickness, and the first thickness is larger than the fourth thickness.

11. The piezoelectric actuating plate according to claim 10, wherein the third thickness is equal to the second thickness.

12. The piezoelectric actuating plate according to claim 10, wherein the bulging surface of the bulge and the top surface of the outer frame are coplanar, the recessed surface of the at least one recess and the top surface of the at least one bracket are coplanar, and the bottom surface of the suspension plate, the bottom surface of the at least one bracket and the bottom surface of the outer frame are coplanar to form a coplanar bottom surface.

13. The piezoelectric actuating plate according to claim 12, wherein the top surface of the suspension plate, the top surface of the at least one bracket and the recessed surface of the at least one recess are formed by etching to be a stepped structure with the coplanar bottom surface.

14. The piezoelectric actuating plate according to claim 10, wherein the bulging surface of the bulge and the top surface of the outer frame are coplanar, the recessed surface of the at least one recess and the top surfaces of the at least one bracket and the suspension plate are coplanar, and the bottom surface of the suspension plate and the bottom surface of the outer frame are coplanar.

15. The piezoelectric actuating plate according to claim 14, wherein the top surface of the suspension plate, the top surface of the at least one bracket and the recessed surface of the at least one recess are formed by etching to be non-coplanar with each other and to form a stepped-up and stepped-down structure with non-coplanar surfaces.

16. The piezoelectric actuating plate according to claim 10, wherein the third thickness is ranged from 295 μm to 305 μm.

17. The piezoelectric actuating plate according to claim 10, wherein the first thickness is ranged from 265 μm to 275 μm.

18. The piezoelectric actuating plate according to claim 10, wherein the fourth thickness is ranged from 250 μm to 260 μm.

* * * * *